United States Patent
Miyakawa et al.

(10) Patent No.: US 10,529,591 B2
(45) Date of Patent: Jan. 7, 2020

(54) METHOD FOR PRODUCING SILICON CARBIDE COMPOSITE MATERIAL

(71) Applicant: DENKA COMPANY LIMITED, Tokyo (JP)

(72) Inventors: Takeshi Miyakawa, Omuta (JP); Daisuke Goto, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 142 days.

(21) Appl. No.: 15/535,627

(22) PCT Filed: Dec. 10, 2015

(86) PCT No.: PCT/JP2015/084653
§ 371 (c)(1),
(2) Date: Jun. 13, 2017

(87) PCT Pub. No.: WO2016/098681
PCT Pub. Date: Jun. 23, 2016

(65) Prior Publication Data
US 2018/0025919 A1    Jan. 25, 2018

(30) Foreign Application Priority Data
Dec. 18, 2014 (JP) ................... 2014-256201

(51) Int. Cl.
| | | |
|---|---|---|
| C04B 41/88 | (2006.01) | |
| C04B 35/565 | (2006.01) | |
| B28B 1/14 | (2006.01) | |
| B28B 11/24 | (2006.01) | |
| B28B 3/00 | (2006.01) | |
| C04B 35/64 | (2006.01) | |
| H01L 21/48 | (2006.01) | |
| C04B 38/06 | (2006.01) | |
| H01L 23/373 | (2006.01) | |

(52) U.S. Cl.
CPC ............ *H01L 21/4807* (2013.01); *B28B 1/14* (2013.01); *B28B 11/243* (2013.01); *C04B 35/565* (2013.01); *C04B 38/06* (2013.01); *C04B 41/88* (2013.01); *H01L 23/3731* (2013.01)

(58) Field of Classification Search
CPC ............ C04B 41/5155; C04B 35/565; C04B 2235/3418; C04B 2235/3826; C04B 35/624; C04B 38/0045
See application file for complete search history.

(56) References Cited

U.S. PATENT DOCUMENTS 6,620,368 B1 * 9/2003 Wang ................... C03C 1/006
264/344

FOREIGN PATENT DOCUMENTS

| JP | S59-199587 A | 11/1984 |
|---|---|---|
| JP | H05-238804 A | 9/1993 |
| JP | H10-219368 A | 8/1998 |
| JP | 2000-169267 A | 6/2000 |
| JP | 2001-334517 A | 12/2001 |

OTHER PUBLICATIONS

JP 2000-169267 A (Wang) Jun. 20, 2000 (English language machine translation). [online] [retrieved Jan. 2, 2019]. Retrieved from: Espacenet. (Year: 2000).*
Mar. 15, 2016 International Search Report issued in International Patent Application No. PCT/JP2015/084653.

* cited by examiner

*Primary Examiner* — Erin Snelting
(74) *Attorney, Agent, or Firm* — Oliff PLC

(57) ABSTRACT

A silicon carbide composite that is lightweight and has high thermal conductivity as well as a low thermal expansion coefficient close to that of a ceramic substrate, particularly a silicon carbide composite material suitable for heat dissipating components that are required to be particularly free of warping, such as heat sinks. A method for manufacturing a silicon carbide composite obtained by impregnating a porous silicon carbide molded body with a metal having aluminum as a main component, wherein the method for manufacturing a silicon carbide composite material is characterized in that the porous silicon carbide molded article is formed by a wet molding method, and preferably the wet molding method is a wet press method or is a wet casting method.

12 Claims, No Drawings

METHOD FOR PRODUCING SILICON CARBIDE COMPOSITE MATERIAL

TECHNICAL FIELD

The present invention pertains to a manufacturing method for a silicon carbide composite material suitable for heat dissipating components or heat sinks used in semiconductor circuit boards on which electronic components such as semiconductor elements or electrical components are installed, in particular, ceramic substrates used in power modules, etc.

TECHNICAL BACKGROUND

In recent years, the miniaturization of circuit boards and the integration of semiconductor elements have advanced rapidly and further improvements in the heat dissipation characteristics of circuit boards, particularly ceramic circuit boards using ceramics as a substrate are desired. Ceramics such as silicon carbide (SiC) to which beryllia (BeO) has been added, aluminum nitride (AlN), silicon nitride ($Si_3N_4$), etc. have attracted attention as ceramic circuit boards having excellent heat dissipation properties.

When using the above ceramic substrates as circuit boards or substrates for packages, heat emitted from electrical and electronic components such as semiconductor elements and transmitted to ceramic substrates is discharged to the outside via a heat dissipating component called a heat sink provided on the back side of the circuit board, which prevents the occurrence of malfunctions due to temperature rises in the semiconductor components and ensures the performance characteristics of the circuit board.

Copper is known in typical heat sinks, but when applied to a ceramic circuit board, there is the problem of, due to the difference in the thermal expansion coefficients of copper and the ceramic circuit board, cracks or fractures occurring in the ceramic substrate when heated or exposed to heat cycles in which the semiconductor components operate and halt, or cracks arising in soldering parts coupling the ceramic substrate and the heat sink.

For this reason, in fields that demand particularly high reliability, Mo/W, the thermal expansion coefficient of which differs little from that of ceramic substrates, is used as a heat sink. However, the specific weights of each of the metals in Mo/W are high, causing heat sinks or ceramic circuit boards to which they are bonded to be heavier, so Mo/W is not preferred for uses in which the lightening of heat dissipating components is desired, for example, for installation on moving devices such as automobiles or train cars. Furthermore, Mo and W also have the flaw of being rare and expensive.

Due to the abovementioned circumstances, metal-ceramic composites known as MMCs (Metal Matrix Composites) in which copper, aluminum or alloys thereof are reinforced with inorganic particles or fibers, have gathered attention in recent years. (Patent Documents 3 and 4)

MMCs generally are composites in which a preform is formed by molding inorganic particles or fibers which are reinforcing materials ahead of time, and impregnating a metal or alloy between the reinforcing materials in the preform. Alumina, silicon carbide, aluminum nitride, silicon nitride, silica, carbon, etc. are used in reinforcing materials. (Patent Document 1)

When attempting to raise the thermal conductivity of a metal-ceramic composite, it is necessary to select substances having high thermal conductivity as the reinforcing materials and the metal or alloy to be impregnated. Additionally, the wettability, interface reaction, etc. of the reinforcing materials and the metal or alloy have effects on the thermal conductivity and strength of the obtained metal-ceramic composite. (Patent Document 2)

For application to the above uses, the use of metals having aluminum as a main component in a preform having silicon carbide as a main component in the reinforcing materials as a combination obtaining a metal-ceramic composite provided with light weight, high thermal conductivity and moreover, a low thermal expansion coefficient of a similar degree to that of various ceramic substrates, is gathering attention. (Patent Document 4)

[Patent Document 1] JP H05-238804 A
[Patent Document 2] JP S59-199587 A
[Patent Document 3] JP H10-219368 A
[Patent Document 4] JP 2000-169267 A

SUMMARY OF THE INVENTION

Properties such as the thermal conductivity and thermal expansion coefficient of a metal-ceramic composite (hereinafter referred to as a silicon carbide composite) obtained by using a metal having aluminum as a main component as the metal to be impregnated are affected by the silicon carbide content in the silicon carbide composite, but the content is decided by the volume density of the silicon carbide molded body (preform) to which the metal is impregnated. This is because the metal is impregnated into a cavity in the preform. Accordingly, controlling the properties of the preform is important in order to obtain a silicon carbide composite having the desired properties.

A publicly known manufacturing method for a ceramic sintered body may be employed as a method to obtain a silicon carbide molded body. For example, a method in which a silicon carbide powder is used as a raw material, an additive which readily exhibits strength is added thereto when molding or firing, a shape is imparted with a method such as a press, and the powder is subsequently heated to obtain a silicon carbide molded body. However, in methods using a binding agent such as methyl cellulose as the additive when molding, there is the problem of the fired parts of the binding agent becoming spaces, resulting in the filling rate (silicon carbide content in the composite material) falling and conversely, if the amount of the binding agent is reduced, there is the problem of sedimentation differences occurring during molding due to the difference in particle sizes in the silicon carbide powder and only molded bodies having large local filling rate differences being able to be obtained.

For this reason, when attempting to obtain a plate-shaped molded body with the aim of obtaining a heat sink, a molded body having differences in the filling rate in the thickness direction thereof is obtained, and in the silicon carbide composite obtained from the molded body, there are differences between the front and back characteristics such as thermal conductivity and thermal expansion coefficient, and warp occurs due to the differences in such characteristics.

If warping occurs, circuit boards, radiating fins, etc. cannot be bonded to a heat dissipating component and even supposing that they were bonded, this would adversely affect thermal conduction, becoming a major problem. Further, this method has the problem of the strength of the molded body after firing being low, so the molded body is pulverized due to being handled before impregnation or impacts or the like during impregnation and a silicon carbide composite having the desired properties being difficult to obtain.

Due to the abovementioned circumstances, in general, methods in which a sintering binder such as a polymer compound and silica powder is added to the silicon carbide powder, the powder is molded by employing a dry molding method, and the molded body is then sintered are used. However, these methods use a mold and thus require an expensive device that undertakes or endures a large pressure of hundreds of kg/cm$^2$ and there are problems such as the mold readily wearing away. Further, there are problems such as there being the need to add large amounts of the polymer compound or silica powder to make the raw material powder flow within the mold, the silicon carbide content failing as a result, and the thermal conductivity of the obtained silicon carbide composite falling.

The present invention was conceived of in view of such circumstances, and the purpose of the present invention is to provide, stably and by an inexpensive method, a silicon carbide composite that is lightweight and that has high thermal conductivity as well as a low thermal expansion coefficient close to that of a ceramic substrate, particularly a silicon carbide composite material suitable for heat dissipating components such as heat sinks that are required to be free of warping.

That is, the present invention is a method for manufacturing a silicon carbide composite formed by impregnating a metal having aluminum as a main component in a porous silicon carbide molded body, characterized in that the porous silicon carbide molded body is formed by obtaining a slurry from a silica sol; a silica sol gelling agent which is a polyalkylene glycol including a styrene-maleic anhydride copolymer or a derivative thereof; and silicon carbide powder having a particle size of 10-200 μm, drying a wet preform obtained from the slurry via a wet press method or a wet casting method at a drying temperature of no less than 80° C. to less than 100° C., followed by further firing the dried wet preform at 800° C. to 1100° C., and impregnating the porous silicon carbide molded body with a metal having aluminum as a main component.

According to the manufacturing method for a silicon carbide composite of the present invention, a tabular silicon carbide composite having a high level thermal conductivity of 200 W/mK, a thermal expansion coefficient so low as to be roughly that of a ceramic substrate, and low warping can be stably obtained. Further, according to the manufacturing method for a silicon carbide composite of the present invention, an expensive press device necessary for the high pressure needed in conventional dry molding methods is not required, and there is no mold wear, so the silicon carbide composite can be mass produced at a low price.

MODES FOR CARRYING OUT THE INVENTION

In consideration of the above circumstances, the inventors of the present invention considered various manufacturing methods for silicon carbide composites and found that it is possible, by finely controlling and creating a silicon carbide molded body; which is a raw material for the silicon carbide composite, to stabilize a silicon carbide composite having high thermal conductivity with a low thermal expansion coefficient, and, in particular, to obtain a tabular silicon carbide composite suitable for heat sinks, arriving at the present invention.

That is, when obtaining a molded body from the silicon carbide powder, the inventors of the present invention selected silica sol as a silica component to be blended with the silicon carbide powder in order to ensure the strength of the molded body and obtained a silicon carbide molded body suitable for heat sinks, etc. having extremely low warping and small differences in the silicon carbide filling rate that could not be obtained using conventional wet molding methods by further blending a silica sol gelling agent, and further, obtained the knowledge that a silicon carbide composite having high thermal conductivity with a low thermal expansion coefficient can be stably obtained by using the silicon carbide molded body obtained via the wet molding method, arriving at the present invention.

As stated above, the silicon carbide molded bodies used to obtain conventional silicon carbide composites are largely created by dry molding methods such as dry press methods, etc., but these involve problems such as requiring the use of expensive devices or extreme wear on molds, whereas the present invention is characterized in that wet molding methods are employed.

Regarding these wet molding methods, there are extrusion molding methods, wet press methods, and wet casting methods, but according to the considerations of the present inventors, to increase the silicon carbide filling rate and to obtain a silicon carbide composite having the desired properties, a wet casting method or wet press method capable of applying pressure to a raw material in a direction perpendicular to the plate of a tabular article and molding is preferable.

The manufacturing method for a silicon carbide composite according to the present invention shall be explained in detail below, providing examples of cases using a wet press method.

Regarding the raw material silicon carbide powder, it is preferable that the particles constituting the powder are highly thermally conductive and it is preferable that a high purity silicon carbide powder having a silicon carbide component of at least 99 mass % and generally exhibiting a "green" color be used. Further, in order to achieve the objective of the present invention, a silicon carbide molded body having a filling rate of 50-80 vol %, preferably 60-75 vol %, may be obtained from the raw material silicon carbide powder. In order to increase the filling rate of the silicon carbide in the molded body and, accordingly, the silicon carbide content in the silicon carbide composite, the silicon carbide powder may have an appropriate particle size distribution and for this purpose, may be an appropriate blend of two or more powders.

The present invention is characterized in that, in order to obtain a silicon carbide molded body having a high filling rate with a wet molding method, a silica sol and a gelling agent of the silica sot are added to the raw material silicon carbide powder. A commercially available silica sol having a solid content concentration of about 20 mass % may be used as the silica sol. A solid content concentration of about 0.5-10 parts by mass with respect to 100 parts by mass of the silicon carbide is sufficient as the blending amount of the silica sol, but a solid content concentration of 1-3 parts by mass is preferable. This is because the strength of a molded body obtained with a solid content concentration of less than 0.5 parts by mass is not sufficient even when fired, while conversely, when the concentration is greater than 10 parts by mass, the filling rate of the silicon carbide in the obtained molded body is not high, and the objective of the present invention cannot be achieved.

The present invention is characterized in that a gelling agent is added to the silica sol. By gelling a silica sol through a wet molding step and a subsequent drying step and firing step, the moisture content that controls the fluidity of the raw material when molding is largely maintained and following the subsequent drying step, the strength of the molded body can be increased, so the drying speed and the temperature rising speed during firing can be increased simultaneous with excellent workability obtaining the practical effect of application to mass production. Polyalkylene glycol including a styrene-maleic anhydride copolymer and derivatives thereof are known as gelling agents for the silica sol and can be used in the present invention. Further, generally, 5-20 parts by mass with respect to 100 solid content parts by mass of the silica sol is sufficient as the amount of the silica sol gelling agent. In addition, while this is naturally the case, a so-called water reducing agent can be used as the gelling agent.

In the present invention, it is preferable that the raw material further contain a water-soluble polymer substance. By further containing the water-soluble polymer substance, sedimentation of the silicon carbide in the large amount of moisture present occurs during wet molding, which prevents local differences in the filling rate of the silicon carbide originating due to differences in particle size from occurring. Methyl cellulose, polyvinyl alcohol, high molecular weight unsaturated polycarboxylic acid, a long chain amine salt of high molecular weight unsaturated polycarboxylic acid, etc. are listed as the water-soluble polymer substance, but according to the experimental considerations of the present inventors, high molecular weight unsaturated polycarboxylic add and the long chain amine salt of high molecular weight unsaturated polycarboxylic acid do not lower the silicon carbide filling rate of the silicon carbide molded body, and are therefore preferable. Further, the amount of the water-soluble polymer substance added may be 0.05-2.0 parts by mass with respect to 100 parts by mass of the silicon carbide powder and 0.1-1.0 parts by mass is a preferable range.

Furthermore, in the present invention, it is preferable that a compatible silicon resin be added to the water-soluble polymer substance. The silicon resin functions as a sintering binder similar to the silica sol through drying and firing following wet molding, so, substantially, organic substances such as the water-soluble polymer substance volatize during the drying and firing steps and serve to prevent the silicon carbide filling rate in the obtained molded body from falling. The amount of the silicon resin added is generally 1-10 parts by mass with respect to 1.00 parts by mass of the water-soluble polymer substance.

The silicon carbide powder with which the above additive is blended exhibits a state showing viscosity that substantially can be called slurry containing 15-80 parts by mass water with respect to 100 parts by mass of silicon carbide. In order to mass produce silicon carbide molded bodies of a fixed size when using the slurry in wet molding, a wet press using a mold or a wet casting method may be selected. While the slurry may be applied in either case, mold release of the molded body immediately after molding (the silicon carbide molded body in a wet state; hereafter referred to as wet preform) is poor, which becomes a problem for mass production.

The present invention is characterized in that, in order to solve the problem, an inner surface of the mold is provided with wet paper and further, is set as a carrier for the wet preform obtained by removal from the mold. By doing so, stable mold release can be performed and moreover, the obtained weak wet preform can be conveyed to the following drying step without being deformed or damaged.

Publicly known conditions are sufficient as the main conditions for the wet press method, for example, applying a pressure of 2-5 kg/cm$^2$ and dewatering for about 30 seconds. Further, the conditions for the wet casting method may also be on the basis of publicly known conditions, for example, a dewatering condition of 3-5 minutes is sufficient.

The wet preform obtained via the above operations is dried and further fired, forming a silicon carbide molded body. As drying conditions, it is preferable that free moisture in the molded body be removed, but if sudden volatilization occurs, bubbles arise in the wet preform, causing unevenness in the properties, so it is preferable that drying be performed at a temperature of at least 80° C. and less than 100° C. for no less than one hour. If the temperature is too low or the time is too short, moisture is not sufficiently removed, and if the temperature is too high, bubbles form. There are no particular deficiencies due to the time being too long. Regarding firing, the silica sol is a sintering binder, so it is preferable that firing be performed in a temperature range from 800° C. to 1100° C. and it is preferable that the time be within 2 to 15 hours. If the temperature is too low or the time is too short, sufficient strength is not exhibited, and if the temperature is too high or the time is too long, the molded body is affected by the atmosphere during firing, causing oxidation of the silicon carbide and silica scattering. The atmosphere during firing does not matter as long as it is in the above temperature range and in addition to a gas atmosphere such as air, oxygen, nitrogen, hydrogen, or argon, it may also be a vacuum.

The silicon carbide molded body obtained via the above operations has a silicon carbide filling rate of 50-80 vol %, preferably 60-75 vol %.

The three-point bending strength of the porous silicon carbide molded body is preferably 3 MPa to 14 MPa and yet more preferably 4 MPa to 12 MPa. If the three-point bending strength is lower than this, when the aluminum is impregnated, cracks readily occur in the porous silicon carbide molded body, and if the three-point bending strength is higher than this, it becomes difficult to straighten the warping after compositing a metal having aluminum as a main component. The three-point bending strength is measured with a sample shape of 20 mm×45 mm×5 mm and a support point span of 30 mm.

Next, a silicon carbide composite in which a metal having aluminum as a main component is impregnated is obtained using the silicon carbide molded body. Publicly known methods such as liquid metal forging methods, die cast methods, or improved methods thereof can be used as the method for impregnating the metal having aluminum as a main component. Further, in these methods, it is preferable that the preform be heated immediately prior to the impregnation operation.

As the metal having aluminum as a main component, silicon carbide-containing aluminum alloys, aluminum alloys containing silicon and magnesium, and magnesium-containing aluminum alloys are normally used when fabricating a silicon carbide composite. Of these, aluminum alloys containing silicon and magnesium are preferably selected because they have low molten metal melting points and good workability, and from the viewpoint of improving the thermal conductivity of composites obtained therefrom, magnesium-containing aluminum alloys are preferably selected. In the present invention, silicon in the former is the cause of lowered thermal conductivity, so it is preferable that the amount thereof be at most 18 mass %. Further, considering that workability worsens, but the melting point of the alloy does not fall if the amount of magnesium is low, and that higher amounts of aluminum are the cause of lowered thermal conductivity in composites obtained therewith, it is preferable that the amount of magnesium be 0.5-2.5 mass %.

Below, the present invention shall be explained in further detail on the basis of the examples and comparative examples.

EXAMPLES

Example 1

710 g of coarse grain SIC powder (NG-80 D50=220 μm manufactured by Pacific Rundum Co., Ltd.) and 290 g of fine grain SiC powder (GC-1000F D50=11 μm manufactured by Yakushima Denko Co., Ltd.) were placed in a universal mixer device and mixed for five minutes. D50 (median diameter) of the mixed powder was 209 μm. Next, 120 g of a silica sol aqueous solution (Snowtex manufactured by Nissan Chemical Industries, Ltd.; 20 mass % solid content concentration) was added and mixed for five minutes, after which 35 g of a silica gelling agent (Super-200 manufactured by Denka Grace) and 15 g of water were added and mixed for five minutes. Furthermore, 1.5 g of an organic additive (BYK-P104S manufactured by BYK Additives and Instruments; 50% active components) was added and mixed for five minutes. The mixture (slurry) was stored in a polyethylene vessel. Even after one week elapsed, no component separation of the silicon carbide, such as sedimentation, in the slurry was recognized.

The slurry (paste) was poured into a mold for a wet press after paper that had absorbed water was applied in water and aspiration for one second, and pressed at a pressure of 2 kg/cm$^2$ and aspirated for 30 seconds. Next, after the pressure was released, compressed air was instantaneously introduced into the mold and a molded wet preform was recovered. The wet preform was conveyed with the paper and dried on a flat plate at a temperature of 95° C. for three hours.

After the drying step, the molded body was fired at a temperature of 1030° C. for four hours in an air atmosphere and a silicon carbide molded body was obtained. The silicon carbide filling rate for the entirety of the silicon carbide molded body was 71 vol %. Further, the difference between the silicon carbide filling rate near the front surface of the silicon carbide molded body and that near the rear surface was below 0.5% and within a measurement error range. The three-point bending strength of the silicon carbide molded body was 10 MPa.

The thermal conductivity of a silicon carbide composite obtained by high-pressure impregnating an aluminum alloy into the silicon carbide molded body was 212 W/mK, the thermal expansion coefficient was 6.5 ppm/K and the warp was 11 μm per 10 cm. In the present embodiment, a straight line, in which a central part of a tabular heat dissipating component (the central part of the heat dissipating component may be an intersection between diagonal lines on a plate surface of a substantially rectangular plate) serves as a center point, connecting both endpoints of line segments in the lengthwise direction or the widthwise direction of a plate surface of the heat dissipating component is imagined, the length of a line perpendicular to the straight line passing through the center point is measured and converted into an amount per 10 cm, and the large value in the lengthwise direction and the widthwise direction is defined as the amount of warp.

Example 2

A silicon carbide molded body was obtained in the same manner as in Example 1, except that the wet preform was dried at 85° C. for five hours and fired at 980° C. for six hours. The difference between the silicon carbide filling rate near the front surface of the silicon carbide molded body and that near the rear surface was 0.5% or less and within a measurement error range. The three-point bending strength of the silicon carbide molded body was 4 MPa. Furthermore, a silicon carbide composite was obtained using the silicon carbide molded body in a similar way as in Example 1. The thermal conductivity of the silicon carbide composite was 208 W/mK, the thermal expansion coefficient was 6.7 ppm/K and the warp was 14 μm per 10 cm.

Example 3

A silicon carbide molded body was obtained in the same manner as in Example 1, except that GC-500F D50=35 μm manufactured by Yakushima Denko Co., Ltd was used as the rough grain SiC powder and GMF-CL-#6000 D50=2.3 μm manufactured by Pacific Rundum Co., Ltd. was used as the fine grain SiC powder. D50 of the mixed powder was 30 μm. The difference between the silicon carbide filling rate near the front surface of the silicon carbide molded body and that near the rear surface was 0.5% or less and within a measurement error. The three-point bending strength of the silicon carbide molded body was 5 MPa. Furthermore, a silicon carbide composite was obtained using the silicon carbide molded body in a manner similar to Example 1. The thermal conductivity of the silicon carbide composite was 202 W/mK, the thermal expansion coefficient was 7.5 ppm/K and the warp was 19 μm per 10 cm.

Comparative Example 1

A silicon carbide molded body was obtained in the same manner as in Example 1, except that the firing temperature was set to 750° C. The difference between the silicon carbide filling rate near the front surface of the silicon carbide molded body and that near the rear surface was 0.5% or less and within a measurement error range. The three-point bending strength of the silicon carbide molded body was 2 MPa. Furthermore, a silicon carbide composite was obtained using the silicon carbide molded body in a similar manner as Example 1. The thermal conductivity of the silicon carbide composite was 210 W/mK, the thermal expansion coefficient was 6.8 ppm/K and the warp was 36 μm per 10 cm.

Comparative Example 2

A silicon carbide molded body was obtained in the same manner as in Example 1, except that the firing temperature was set to 1150° C. and the time to 24 hours. The difference between the silicon carbide filling rate near the front surface of the silicon carbide molded body and that near the rear surface was 0.5% or less and within a measurement error range. The three-point bending strength of the silicon carbide molded body was 14 MPa. Furthermore, a silicon carbide composite was obtained using the silicon carbide molded body in a manner similar to Example 1. The thermal conductivity of the silicon carbide composite was 185 W/mK, the thermal expansion coefficient was 6.3 ppm/K and the warp was 11 μm per 10 cm.

Comparative Example 3

A silicon carbide molded body was obtained in the same manner as in Example 1, except that the drying temperature for the wet preform was set to 110° C. The difference between the silicon carbide filling rate near the front surface of the silicon carbide molded body and that near the rear surface was 0.5% or less and within a measurement error range. The three-point bending strength of the silicon carbide molded body was 2 MPa. Furthermore, a silicon carbide composite was obtained using the silicon carbide molded body in a manner similar to Example 1. The thermal conductivity of the silicon carbide composite was 210 W/mK, the thermal expansion coefficient was 6.8 ppm/K and the warp was 18 µm per 10 cm.

As a result of observing the internal defects in the silicon carbide composites obtained in Examples 1-3 and Comparative Examples 1-3 with an ultrasonic defect testing device, no abnormalities were observed in Examples 1-3 and Comparative Example 2, but internal cracks with lengths 30 mm or greater were observed in the silicon carbide composites of Comparative Example 1 and Comparative Example 3. Further, multiple flaws of about ø150 µm were observed in the interior of the silicon carbide molded body of Comparative Example 3.

The invention claimed is:

1. A method for manufacturing a silicon carbide composite, comprising:
    obtaining a slurry by forming a mixture that includes a silica sol, a silica sol gelling agent that is a polyalkylene glycol including a styrene-maleic anhydride copolymer or a derivative thereof, and a silicon carbide powder having a particle size of 10-200 µm;
    obtaining a preform from the slurry via a wet press method or a wet casting method;
    drying the preform at a drying temperature of no less than 80° C. to no more than 95° C.;
    firing the preform after drying at a firing temperature of 800° C. to 1100° C. to form a porous silicon carbide molded body; and
    impregnating the porous silicon carbide molded body with a metal having aluminum as a main component to form the silicon carbide composite,
    wherein the method does not include a step of removing moisture at a temperature of 100° C. or more.

2. The method of claim 1, wherein the porous silicon carbide molded body has a three-point bending strength of 3 MPa to 14 MPa.

3. The method of claim 1, wherein the porous silicon carbide molded body has a three-point bending strength of 4 MPa to 12 MPa.

4. The method of claim 1, wherein the silicon carbide composite is free of internal cracks with lengths that are 30 mm or greater.

5. The method of claim 1, wherein the drying of the preform is dried for no less than one hour.

6. The method of claim 1, wherein the preform is dried for one to five hours.

7. A method for manufacturing a silicon carbide composite, comprising:
    obtaining a slurry by forming a mixture that includes a silica sol, a silica sol gelling agent that is a polyalkylene glycol including a styrene-maleic anhydride copolymer or a derivative thereof, and a silicon carbide powder having a particle size of 10-200 µm;
    obtaining a preform from the slurry via a wet press method or a wet casting method;
    drying the preform at a drying temperature of no less than 80° C. to no more than 95° C. for entire duration of drying prior to firing;
    firing the preform after drying at a firing temperature of 800° C. to 1100° C. to form a porous silicon carbide molded body; and
    impregnating the porous silicon carbide molded body with a metal having aluminum as a main component to form the silicon carbide composite.

8. The method of claim 7, wherein the porous silicon carbide molded body has a three-point bending strength of 3 MPa to 14 MPa.

9. The method of claim 7, wherein the porous silicon carbide molded body has a three-point bending strength of 4 MPa to 12 MPa.

10. The method of claim 7, wherein the silicon carbide composite is free of internal cracks with lengths that are 30 mm or greater.

11. The method of claim 7, wherein the preform is dried for no less than one hour.

12. The method of claim 7, wherein the preform is dried for one to five hours.

* * * * *